(12) United States Patent
Gibson et al.

(10) Patent No.: US 11,198,284 B2
(45) Date of Patent: Dec. 14, 2021

(54) LARGE FORMAT 3D PRINTING AUGMENTED WITH 3D SCANNING AND ANOMOLY TRACKING FEEDBACK

(71) Applicant: ORD SOLUTIONS INC., Cambridge (CA)

(72) Inventors: Christopher John Elmer Gibson, Cambridge (CA); Peter Eldon Leis, Waterloo (CA)

(73) Assignee: 2679667 Ontario Inc.

( * ) Notice: Subject to any disclaimer, the term of this patent is extended or adjusted under 35 U.S.C. 154(b) by 0 days.

(21) Appl. No.: 16/060,949

(22) PCT Filed: Dec. 15, 2016

(86) PCT No.: PCT/CA2016/051486
§ 371 (c)(1),
(2) Date: Jun. 10, 2018

(87) PCT Pub. No.: WO2017/106965
PCT Pub. Date: Jun. 29, 2017

(65) Prior Publication Data
US 2018/0361729 A1 Dec. 20, 2018

Related U.S. Application Data

(60) Provisional application No. 62/270,122, filed on Dec. 21, 2015.

(51) Int. Cl.
*B33Y 30/00* (2015.01)
*B33Y 10/00* (2015.01)
*B29C 64/106* (2017.01)
*B33Y 50/02* (2015.01)
*B25J 9/16* (2006.01)
*G06F 17/50* (2006.01)

(52) U.S. Cl.
CPC ............ *B33Y 30/00* (2014.12); *B25J 9/1697* (2013.01); *B33Y 10/00* (2014.12); *B33Y 50/02* (2014.12); *G06F 17/50* (2013.01)

(58) Field of Classification Search
CPC ... B29C 64/106; B29C 67/0088; B33Y 30/00; B33Y 10/00; B33Y 50/02; B25J 9/1697; G06F 17/50
See application file for complete search history.

(56) References Cited

U.S. PATENT DOCUMENTS 5,216,616 A * 6/1993 Masters ................. B29C 35/08
264/401
7,805,269 B2 * 9/2010 Glossop ................. A61B 34/20
702/94

(Continued)

*Primary Examiner* — Ronald D Hartman, Jr.

(57) ABSTRACT

The disclosure is directed at a system, apparatus and method for 3D printing an object using an industrial robot; such object is larger and may be more accurate than the print volume and accuracy of the industrial robot that is performing the print. The system is further capable of scanning the irregular 3D surface of the printing platform in which to create the 3D object and adapt the toolpath to print on this surface. The system is further capable of scanning the 3D surface of a specimen that is larger than the print volume of the industrial robot and make a scaled copy larger or smaller. The system is also capable of monitoring the quality of the object being printed while the print is in process.

14 Claims, 12 Drawing Sheets

(56) References Cited

U.S. PATENT DOCUMENTS

| | | | | |
|---|---|---|---|---|
| 2002/0048396 | A1* | 4/2002 | Bewley, Jr. | B44B 1/006 |
| | | | | 382/154 |
| 2007/0228592 | A1* | 10/2007 | Dunn | B29C 64/386 |
| | | | | 264/40.4 |
| 2014/0052288 | A1* | 2/2014 | El-Siblani | G05B 19/042 |
| | | | | 700/119 |
| 2014/0074274 | A1* | 3/2014 | Douglas | B33Y 50/02 |
| | | | | 700/105 |
| 2014/0374935 | A1* | 12/2014 | Flitsch | B29C 67/0088 |
| | | | | 264/40.1 |
| 2015/0005920 | A1* | 1/2015 | Matsumoto | B29C 64/112 |
| | | | | 700/119 |
| 2016/0176115 | A1* | 6/2016 | Becker | B25J 9/1679 |
| | | | | 425/150 |
| 2016/0288330 | A1* | 10/2016 | Konolige | H04N 13/239 |
| 2016/0303806 | A1* | 10/2016 | Mercelis | G03F 7/0037 |
| 2017/0021527 | A1* | 1/2017 | Grivetti | E04G 21/04 |
| 2017/0028634 | A1* | 2/2017 | Evans | B29C 69/001 |
| 2017/0066186 | A1* | 3/2017 | Gardiner | B33Y 10/00 |
| 2019/0255777 | A1* | 8/2019 | Fiechter | B29C 64/245 |

* cited by examiner ately accurate; free to move relative to each other and the printed object; to form an unlimited size print volume, by way of tracking the pose of each component, and mathematically combining the coordinate systems into the coordinate system of the object being printed, or specimen being scanned. Various combinations of components will also allow for a subset of functions that still have value independently.

LARGE FORMAT 3D PRINTING AUGMENTED WITH 3D SCANNING AND ANOMOLY TRACKING FEEDBACK

CROSS-REFERENCE TO OTHER APPLICATIONS

This application claims the benefit of U.S. Patent Application No. 62/270,122, filed Dec. 21, 2015, which is incorporated herein by reference.

FIELD OF THE DISCLOSURE

This disclosure relates generally to the field of additive manufacturing, and more specifically, to a method and apparatus for large format three-dimensional (3D) printing.

Background to the Disclosure

As computers within manufacturing have advanced, so have methods of producing three-dimensional (3D) computer models and the ability to manufacture these models into printed objects using rapid prototyping techniques. Additive manufacturing is one of these techniques.

It is well known in the art how to produce fused deposition printers typically using a Cartesian style industrial robot. An example of this type of robotic printer is MakerBot™ Industries' Replicator. When printing an object, these robotic printers typically apply a very thin layer of material in the XY plane. The object is then moved relative to the print head in the Z direction and another layer is added. This continues until the 3D object is completely printed. This method is well suited to complex geometries that would be difficult to manufacture using subtractive techniques, such as with a computer numerical control (CNC) milling machine. There are also well known methods of using robotic arms and delta robots to move the print head (relative the object being printed), but due to the complex parallel movements, the accuracy printed object may be affected. The accuracy of the position of the print head greatly effects the accuracy of the final printed object. In order to improve accuracy, higher accuracy robot arms are typically used which increase the cost and complexity of the overall robotic printing system.

Also, the final printed object is typically limited to the size of the print volume of the robotic printer, although techniques exist to divide up the printing of the 3D object into smaller units and then attaching the separately printed units into the finished printed object. It is understood that large and very large format prints require very large industrial robot printers that increase exponentially in cost and complexity.

Therefore, there is provided a method and apparatus to produce large printed 3D objects without the cost and complexity of very large industrial robots or the need to fasten together smaller printed objects to form a large printed object using adhesives or welding.

SUMMARY OF THE DISCLOSURE

The disclosure is directed at a method and system for large format three-dimensional (3D) printing. The disclosure may also include a method and apparatus for large specimen 3D scanning and automatic computerized visual feedback.

The disclosure disclosed herein provides a complement of printing options, scanning and visual feedback. One aspect of this disclosure is the breaking apart of sub-components that are smaller, lighter, less expensive and less accurate; that are free to move relative to each other and the printed object; to form an unlimited size print volume, by way of tracking the pose of each component, and mathematically combining the coordinate systems into the coordinate system of the object being printed, or specimen being scanned. Various combinations of components will also allow for a subset of functions that still have value independently.

In another aspect of the disclosure, all the components of the system can be moved/repositioned as needed and coordination of the printing, scanning, and inspection functions are automatically aligned. Further, the method includes repositioning of the components to incrementally increase the size of the printed object without practical limits beyond the printing envelope of the 3D printer and the measurement volume of the tracking system.

In one embodiment, the method and apparatus uses six-dimensional (6D) tracking techniques with an industrial robot (or 3D printer) to produce a more accurate and unlimited size print. One advantage of the current disclosure is that a lower cost, less accurate industrial robot (compared with current systems) may be used. The apparatus of the disclosure can be portable so the printed object can be formed in its required final placement. In another embodiment, the system includes apparatus for augmenting the method and apparatus of the disclosure with 3D scanning of a specimen, outside and larger than the robot's (or 3D printer's) print volume. In a further embodiment, the system may include apparatus for 3D scanning of the printed object's target base, thus allowing printing directly onto non-planar irregular surfaces. In yet another embodiment, the system may include automatic computer visual feedback, able to operate in a measurement volume much larger that the robot's (or 3D printer's) print volume.

In one aspect of the disclosure, there is provided a system for large format three-dimensional (3D) printing of an object including a processing unit; a tracking system; a 3D printer including a set of components; and a set of trackers in a one-to-one relationship with the set of components, each of the set of trackers defining a local coordinate system for the associated component; wherein the tracking system communicates with the set of trackers to obtain information relating to the local coordinate systems; and wherein the processing unit calculates positions for the set of components within a global coordinate system based on the local coordinate systems.

In another aspect, the tracking system is an optical six-dimensional (6D) tracking system. In yet a further aspect, the 6D tracking system operates based on mechanical positioning constraints, is an optical system or is a magnetic system.

In yet another aspect, the set of components includes an industrial robot component; a platform component; and a print head component mounted to the industrial robot component; wherein the industrial robot component controls movement of the print head with respect to the platform component. In another aspect the set of components may include a scanning apparatus and a robotic arm for controlling movement of and supporting the scanning apparatus.

In another aspect, the processing unit transmits printing instructions to the 3D printer based on the local coordinate systems and measurements of a scanned specimen.

In another aspect of the disclosure, there is provided a method of large format three-dimensional (3D) printing and scanning including determining a global coordinate system; receiving local coordinate systems for selected components of a 3D printer; transforming each of the local coordinate systems to equivalents within the global coordinate system; obtaining measurements of a scanned specimen to be printed; combining the measurements and characteristics of the aligned local coordinate systems to generate printing instructions; and transmitting printing instructions to the 3D printer.

In yet another aspect, determining a global coordinate system includes retrieving coordinate system information from a tracker associated with an object being printed. In yet another aspect, receiving local coordinate systems includes retrieving coordinate system information from trackers associated with components of the 3D printer. In yet another aspect, retrieving coordinate system information is performed magnetically.

Other aspects of the disclosure will become clear when reading the description of the preferred embodiments along with the accompanying figures.

BRIEF DESCRIPTION OF THE DRAWINGS

The disclosure will now be described in detail, with reference to the accompanying drawings of preferred and exemplary embodiments, in which.

DESCRIPTION OF THE PREFERRED EMBODIMENTS

Figure 1:
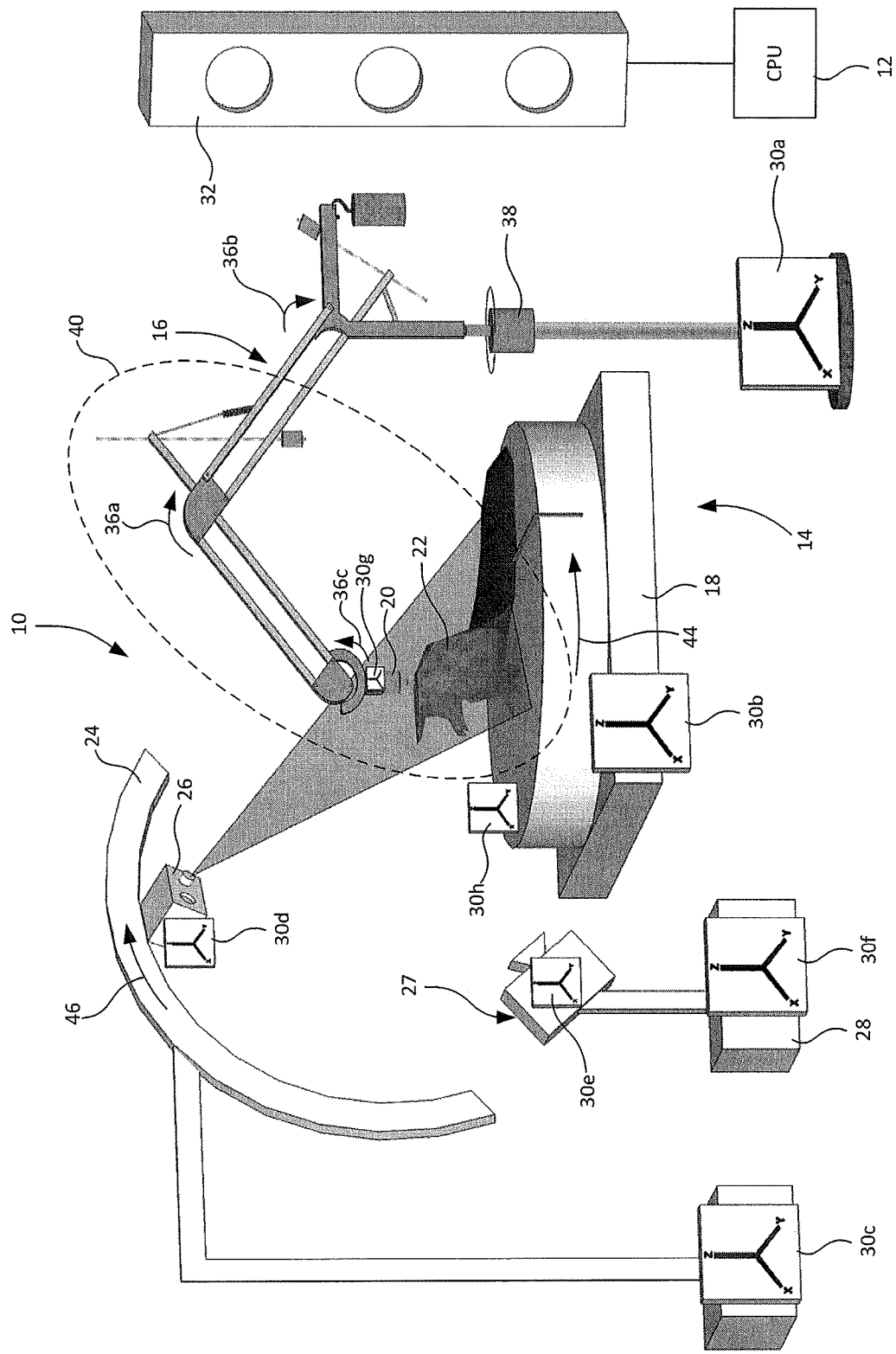
FIG. 1 is a schematic diagram of a three-dimensional (3D) printing system along with an apparatus for large format 3D printing.

The disclosure is directed at a system, apparatus and method for three-dimensional (3D) printing an object that is larger and more accurate than the print volume and accuracy of the 3D printer/scanning apparatus that is performing the print.

In the preferred embodiment, 3D printer/scanner components are broken apart and are able to be moved/repositioned individually. This movement may be performed manually or may be automated. In one embodiment, the components necessary to perform the basic functions of 3D printing include a print platform, a print head (extruder), and a 3D scanner. Other components may include an anomaly tracking sensor. In the current disclosure, the simultaneous position and orientation of each of these components, along with a specimen being scanned and the object being printed are continuously determined during the printing process. The term 'object' will be used to describe the object being printed or manufactured from a 3D computer model. The term 'specimen' will be used to describe a physical entity that is being surface scanned with the desire to create a 3D computer model.

Herein the 3D position (translation x, y, z) and the 3D orientation (rotation yaw, pitch, roll) of any component will be referred to as the component's pose. The pose represents the local coordinate system of each component as measured within a global coordinate system. The global coordinate system will vary depending on the embodiment.

The pose may be represented in any convenient format such as, but not limited to, Euler Angles, Quaternion, rotation matrix, axis and angle, or others as is known in the art. These multiple local coordinate systems, i.e. poses, can be transformed into the global coordinate system such that all measurements and positions of the individual attributes of each component are in one (the global) coordinate system. In a preferred embodiment, the global coordinate system is the pose, or local coordinate system, of the object being printed or the specimen being scanned. Those skilled in the art of mathematical transformation of multiple coordinate systems will understand the methods described herein. As an example to help clarify understanding of changing coordinate systems consider an airplane in flight that is approaching a runway for landing. From a person standing on the ground on Earth's coordinate system, the airplane is above and is approaching the ground at an angle relative to the ground. From the pilot's perspective in the coordinate system of the airplane, the ground is down below and the plane is traveling straight towards the runway. It is the earth that is at an angle relative to the principle axis of the airplane. Calculations can be performed to then translate plane's position in the Earth's coordinate system or calculations can be performed to translate the person's position in the airplane's coordinate system.

Since all measurement attributes of each component can be expressed within a single global coordinate system, or global space, the components can be treated as one connected system that has an unlimited virtual printing and scanning measurement volume.

In one aspect, the system and method of the disclosure is directed at 3D printing with accuracy greater than that of the industrial robot(s) performing the print or, in other words, at a method and system for increasing the accuracy and size of print of a 3D printer.

Turning to FIG. 1, a schematic diagram of a system for large format 3D printing is shown. The system of the disclosure is designed to provide 3D printing with an improved accuracy of what is currently achievable by the 3D printer being used. The system of the disclosure further provides a system which allows for a larger volume print.

As shown, the system 10 includes a central processing unit (CPU) 12 which controls components of a 3D printer 14. The CPU 12 can be any form of data processing and control device as is known in the art, such as, but not limited to, a computer or a processor. The 3D printer 14 includes an industrial robot component 16 and a printing platform 18 along with a print head (extruder) 20 mounted to the industrial robot component 16. In typical use, the 3D printer 14 is used to print a 3D object 22.

Figure 2:
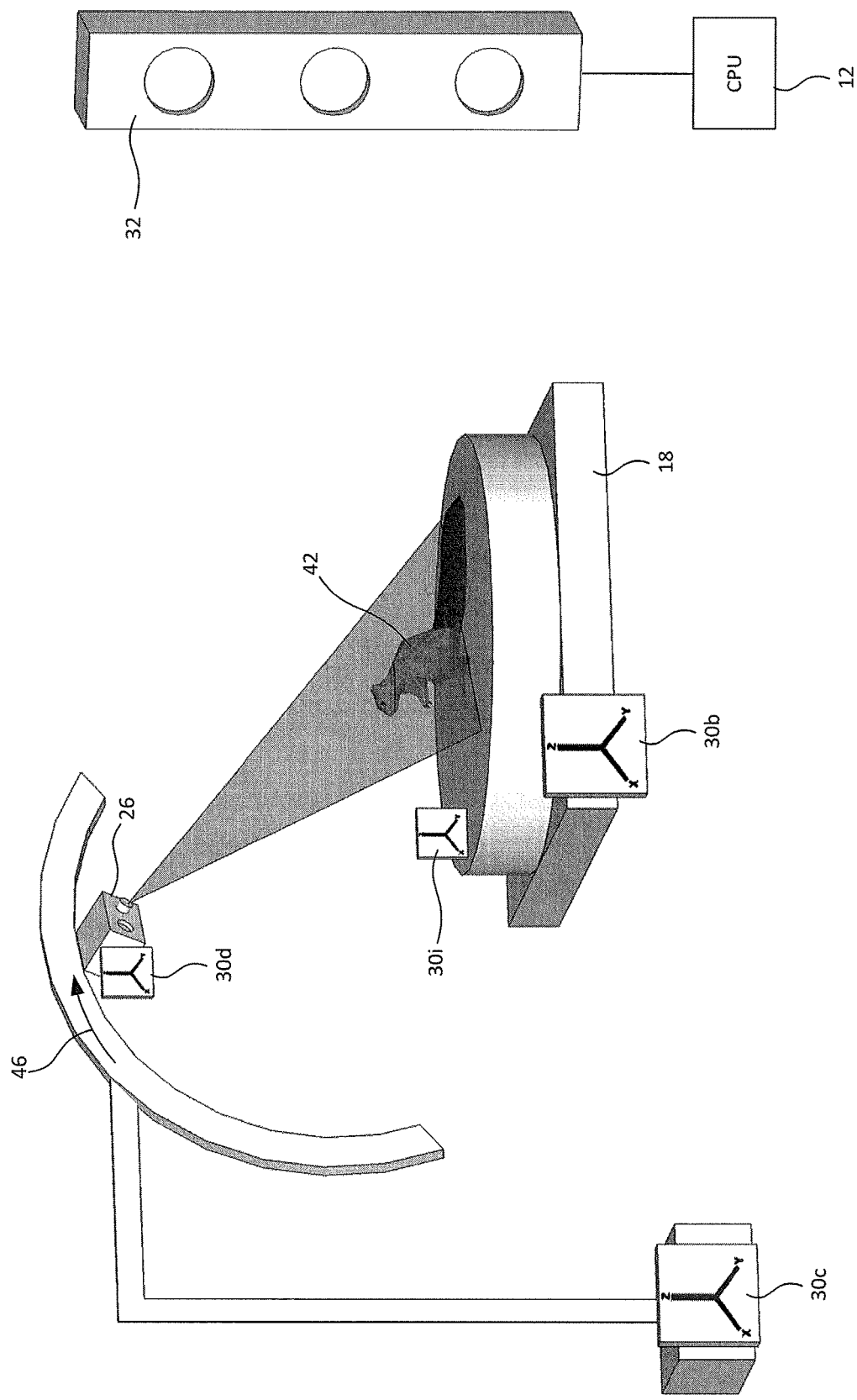
FIG. 2 is a schematic diagram of a scanning system for the 3D printing system of FIG. 1.

In order to create the object 22, a specimen 42 acting as a model for the 3D printed object is may be used. In one embodiment, the specimen 42 may be the object 22 being printed, however, the specimen 42 may also be located remote from the system 10 where the specimen can be scanned. After scanning, the measurements are transmitted to the 3D printer 14 for printing. This is schematically shown in FIG. 2 and will be described in more detail below.

The system 10 further includes a robotic arc 24 (that controls a scanning apparatus 26) and a set of anomaly sensor tracking components 27 and 28. Each of the surface scanning apparatus 26 and the anomaly sensor tracking components 27 and 28 may be seen as being part of the 3D printer 14, however, each perform specific functions within the printing process and therefore may not be part of the 3D printer depending on the design or current functionality of the printer. In the current system, each of the components of the system 10 are associated with individual trackers 30. As such, there is an industrial robot component tracker 30*a*, a first printing platform tracker 30*b*, a second printing platform tracker 30*h*, a robotic arc tracker 30*c*, a scanning apparatus tracker 30*d*, a first anomaly sensor tracking component tracker 30*e*, a second anomaly sensor tracking component tracker 30*f* and a print head tracker 30*g*. Each of the trackers 30 provides pose information of the local coordinate system, with respect to the component that it is associated. In another embodiment, the pose of each component may be determined using a magnetic based system adapted to simultaneously track multiple local coordinate systems in a global coordinate system. In another embodiment, the pose of each component may be determined by the use of various connecting members that rigidly align the components in a known pose, relative to each other in a global coordinate system.

In the current embodiment, a six-dimensional (6D) tracking machine vision system 32 is adapted to return or retrieve the pose of each of the components (via the trackers 30) which can then be transformed into a global coordinate system, such as via the CPU 12. Typically, the local coordinate system (derived, or determined, from tracker 30*h*) of the object being printed 22 is the most important coordinate system and all position and poses of the other components are referenced with respect to the local coordinate system of the object 22 (which is preferably used as the global coordinate system).

Each of the trackers 30 may include, or be instrumented with, a set of three or more light emitting diodes, retroreflective targets, or distinctive patterns or other objects that allow the 6D tracking system 32 to automatically identify the trackers and to determine their respective poses. For simplicity of explanation, the pose and the local coordinate system for the component associated with the tracker are considered one and the same.

Anomaly sensor 27, by way of example in this embodiment, is an electronic camera adapted to send digital images to the control computer 12. These images may then be used to determine if the object bring printed 22 is being printed successfully. In the current embodiment, the camera 27 is preferably adapted with a controlled zoom and automatic focus. The anomaly sensor 27 is preferably mounted to a second anomaly sensor component 28 (such as a robot) which controls the pose of anomaly sensor 27.

The anomaly sensor 27 has a local coordinate system that is established by tracker 30*e* while the robot (seen as anomaly component 28) has a local coordinate system established by tracker 30*f*. In this example, the robot 28 is capable of pan angle and tilt angle motions, allowing the computer 12 to control and point the sensor 27 in a desired direction or any other direction within the range of motion of the robot 28. The zoom of the sensor or camera 27 can be used to optimize the field of view of the image. The intrinsic parametric characteristics of the sensor direction of view and field of view, are preferably known a priori in the local coordinate system of the sensor 27. In one embodiment, the pose of robot 28 along with the pose of sensor 27 are preferably transformed into the global coordinate system of the object being printed 22. Thus the computer 12 may control the sensor 27 as needed. In use, the anomaly sensor 27 can detect different faults including, but not limited to, failure of print head 20 to extrude material, incorrect flow of material, dimensional tolerances and other parameters. The anomaly sensor 27 and robot 28 can be repositioned as needed to have a clear line of sight of the area of interest of the object 22. In another embodiment, a computer controller display (not shown) can assist the user in guiding the optimal placement of the anomaly sensor 27 and robot 28.

In some cases, the anomaly sensor robot 28 may have poor open loop accuracy, however, the pan and tilt angles of the camera 27 can be incrementally adjusted in a feedback loop until the pose of the anomaly sensor 27 is in the desired orientation relative to the pose of robot 28, which is relative to the global coordinate system. If the accuracy of robot 28 is sufficient i.e. the pan and tilt angles are accurately known, then tracker 30*e* is not needed and the pose of the anomaly sensor 27 can be determined in the local coordinate space of the robot 28 by a mathematical model with the pan and tilt angles as input and the pose of the anomaly sensor 27 as output. While beneficial, it will be understood that the anomaly sensors 27 and robot 28 may or may not be present, depending on the design of the system.

Figure 4:
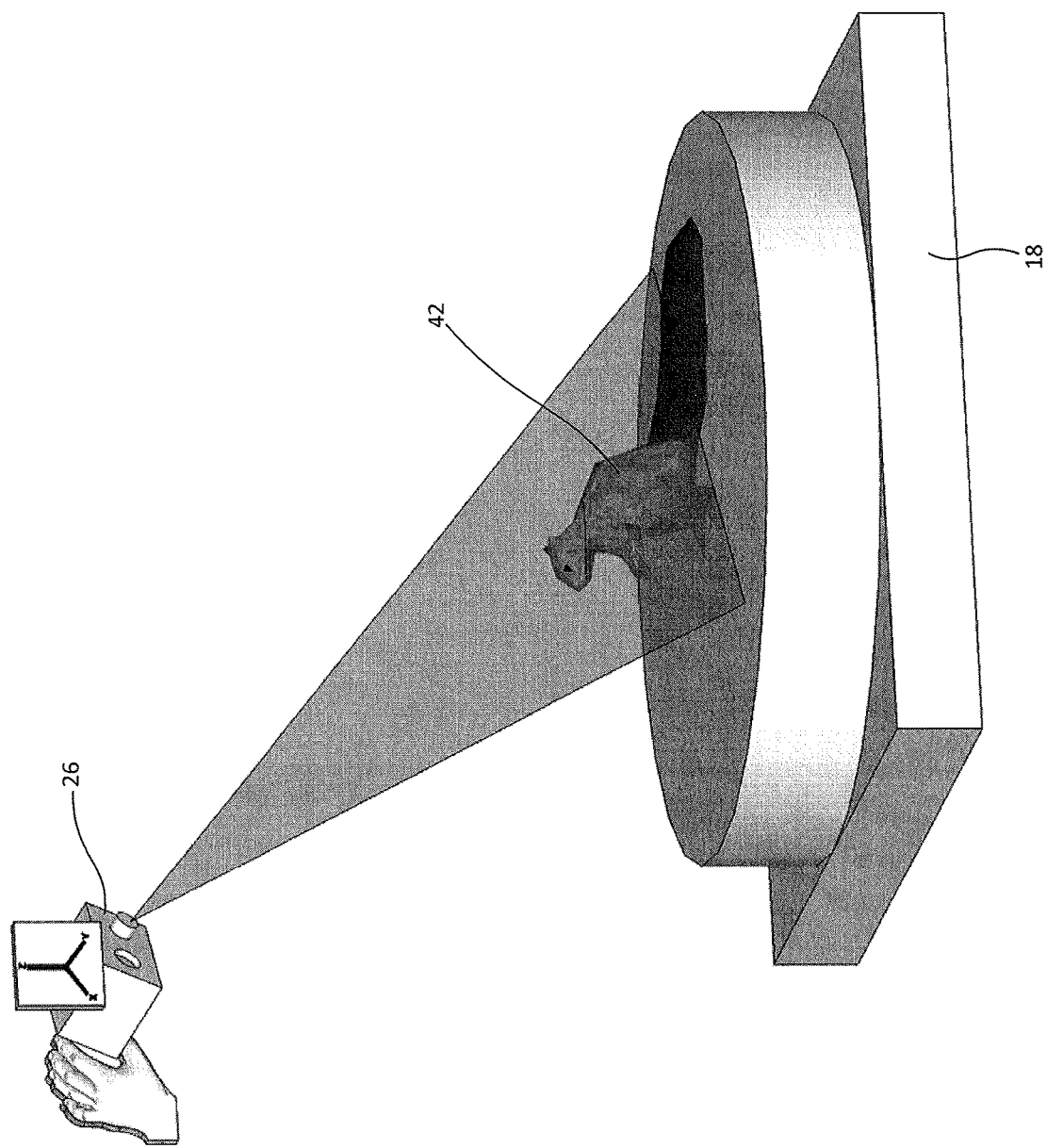
FIG. 4 is a schematic diagram of another embodiment of a scanning system for use with 3D printing system.

Turning to the scanning component 26, as will be understood, the system may or may not include the scanning component 26 depending on the design of the system. In the current embodiment, the 3D scanning component 26 is preferably a line laser scanner able to scan in two dimensions. This scanning can also be done with a laser scanning component in one dimension or multiple line laser scanners obtaining measurements in 3D. Other 3D scanners such as those using structured light, light time of flight, disparity mapping and triangulation, and other methods are also contemplated for the scanning component 26. In this embodiment, the measurements obtained by the scanner 26 are in the coordinate system, or pose, established by tracker 30*d*. The pose and measurements obtained from the scanning component 26 can be transformed into the global coordinate system of the object being printed 22. If a specimen 42 is also located on the print platform, the global coordinate system may also be associated with the specimen 42. The coordinate system established by tracker 30*h* may be used to determine the pose of either the specimen 42, the printed object 22 or both. In an alternative embodiment, the scanning component 26 can be held by hand by the operator and moved in a sweeping motion to produce a point cloud of the specimen 42, as illustrated in FIG. 4.

Referring to FIG. 2, a schematic diagram of a scanning system for use with the 3D printing system of FIG. 1 is shown. In the current embodiment, the scanning system is used to obtain printing measurements of the specimen to produce a 3D computer model. The scanning system includes the scanning component 26 mounted to the robotic arc 24. Depending on the design, the scanning apparatus of FIG. 2 may be or may not be the same as the scanning apparatus of FIG. 1. The scanning component 26 scans the specimen to obtain characteristics of the specimen, such as its measurements, and then transmits this information to the CPU 12 (of FIG. 1). In a preferred embodiment, the specimen 42 is preferably held rigidly to tracker 30*h* during this scanning process, thus specimen 42 and tracker 30*h* together and/or the 6D tracking system 32 and robot arc 24 may be moved during the scanning, allowing the scanning of a very large specimen, much larger than the print volume of the 3D printer 14. The poses for the robotic arc 24, the scanning component 26, the printing platform 18 and the specimen 42 may also be transmitted to the CPU 12 for transformation into the global coordinate system. In another embodiment, as mentioned above and as shown in FIG. 1, the object bring printed 22 may be the specimen or the specimen (not shown) may be also located atop the printing platform 18.

In FIGS. 1 and 2, the scanning component 26 is held by a robotic arc 24. The scanner is moved along the arc 24 along an angle 46. The pose or local coordinate system of the arc 24 is established by the robotic arc tracker 30c. In this configuration, the scanner 26 can be automatically moved relative to the specimen 42 while the specimen 42 is being rotated on platform 18 (FIG. 2) or the object being printed 22 while the object being printed is being rotated on platform 18 (FIG. 1). This allows automatic scanning of either the specimen or the object without requiring a user. Although an arc 24 is shown by way of example, it should be clear that any type of motion device which can receive and move the scanning component 26 is applicable to this disclosure. In another embodiment, the industrial robot 16 may be adapted to hold scanning component 26 in addition to the print head 20.

As may be understood, the arc robot 24 can have poor open loop accuracy, however, the accuracy does not need to be improved using closed loop feedback. The measurement volume of the scanner 26, although smaller than the print volume of robot 16 may be sufficiently large enough to oversample an area of the specimen 42 and thus compensate for any errors in the desired pose of the scanner 26. In other words, the actual pose of the scanner 26 (defined by scanning apparatus tracker 30d) does not have to accurately match the desired pose since the surface data produced by scanner 26 will be in the local coordinate system of scanner 26, independent of any error in angle 46. However, if the accuracy of robot arc 24 is sufficient i.e. angle 46 is accurately known, then the scanning apparatus tracker 30d is not needed and the pose of the scanning apparatus 26 can be determined in the local coordinate space defined by the robotic arc tracker 30c and by a mathematical model with the angles as input and the pose defined by tracker 30d as output.

In operation, the industrial robot component 16, such as a portion of an industrial robot, is controlled to move the print head 20 of the 3D printer 14. In one embodiment, the 3D printer 14 uses fused deposition modeling (FDM) technology whereby the print head extrudes fused PLA plastic, however, other printing technologies, or mediums, may be considered such as, but not limited to, stereolithography (SLA), digital light processing (DLP), selective laser sintering (SLS), selective laser melting (SLM), electronic beam melting (EBM) or laminated object manufacturing (LOM).

Also in this embodiment, the print function can be performed by moving the industrial robot 16 about angles 36a and 36b creating motions in two degrees of freedom. By rotating the print platform 18, as described below, the print head 20 can be translated in three degrees of freedom relative to the object being printed 22. The print head 20 can also rotate by angle 36c to allow plastic to be extruded in different orientations. This is useful for adding PLA material to a partial print of object 22 when the robot 16 or print platform 18 is repositioned during the print. The local coordinate system/pose of the robot 16 is established by the industrial robot component tracker 30a. The print head local coordinate system/pose is established by the print head tracker 30g. Thus the angles 36a and 36b can be determined from taking the pose of the print head 20 and angle 36c in the local coordinate system (defined by tracker 30a) of the robot 16 and by applying a mathematical model of the machine. In one embodiment, this model would include the relative position and orientation of rotation axes about angle 36a and angle 36b. The angles are input to the mathematical model and the 3D pose of print head 20 is the output of the mathematical model. The model can work in reverse to determine the necessary angles to achieve the 3D position of print head 20. In a preferred embodiment, the angles 36a and 36b can be controlled with stepper motors, servos, dc motors, linear motors, etc., working in open loop with limited accuracy. The loop can be closed by the computer 12 since the system determines the exact location of the pose of the print head 20 (defined by tracker 30g) with respect to angle 36a and angle 36b. This feedback can also be used to incrementally adjust angles 36a and 36b in a closed loop until the pose of the print head 20 is achieved within specified tolerances (preferably in the sub-millimeters). This allows a less expensive, less precise position control, and a lighter robot 16.

Figure 6A:
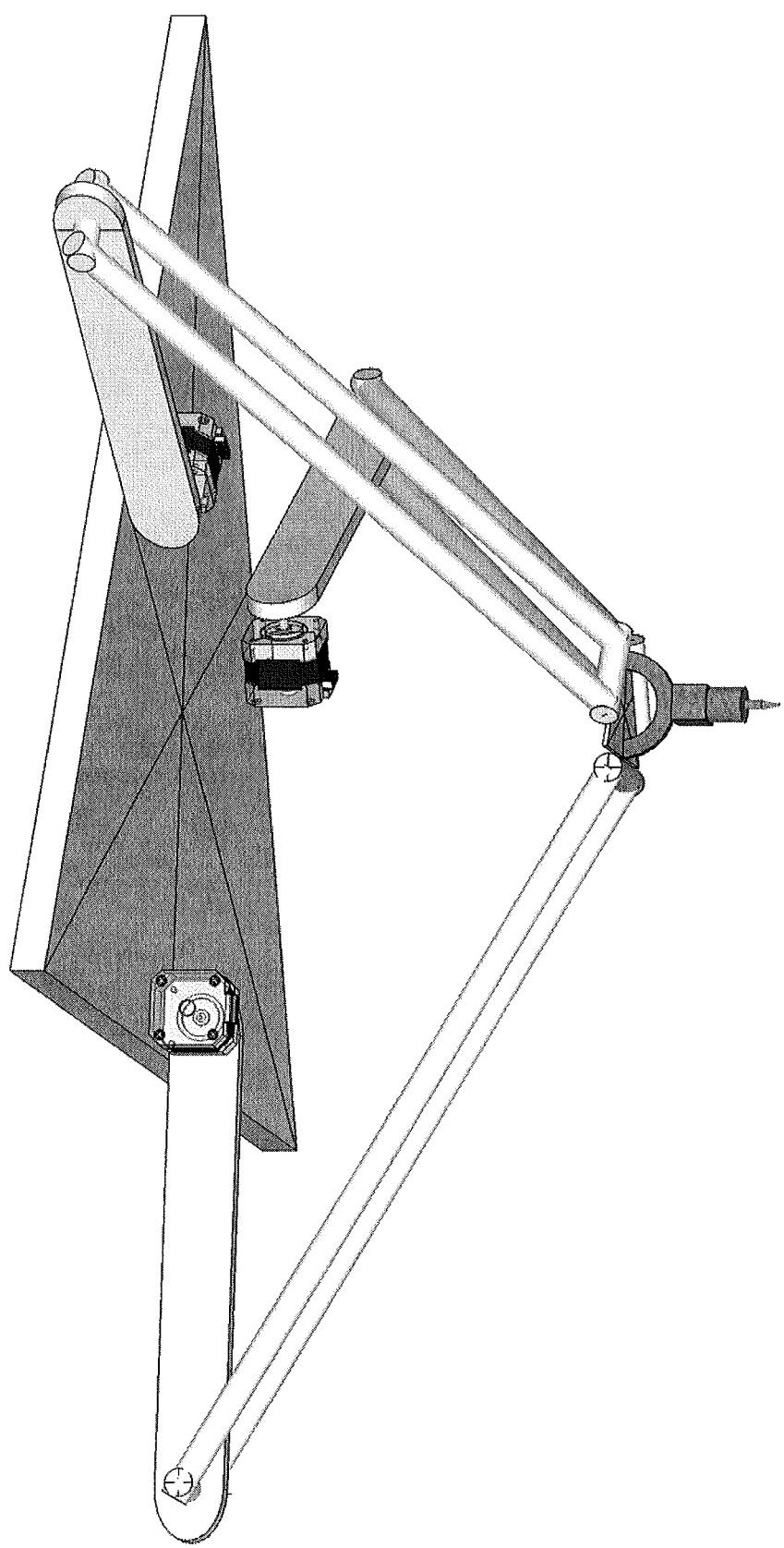
FIGS. 6a to 6c are schematic diagrams of industrial robots for use with the 3D printer system.
Figure 6B:
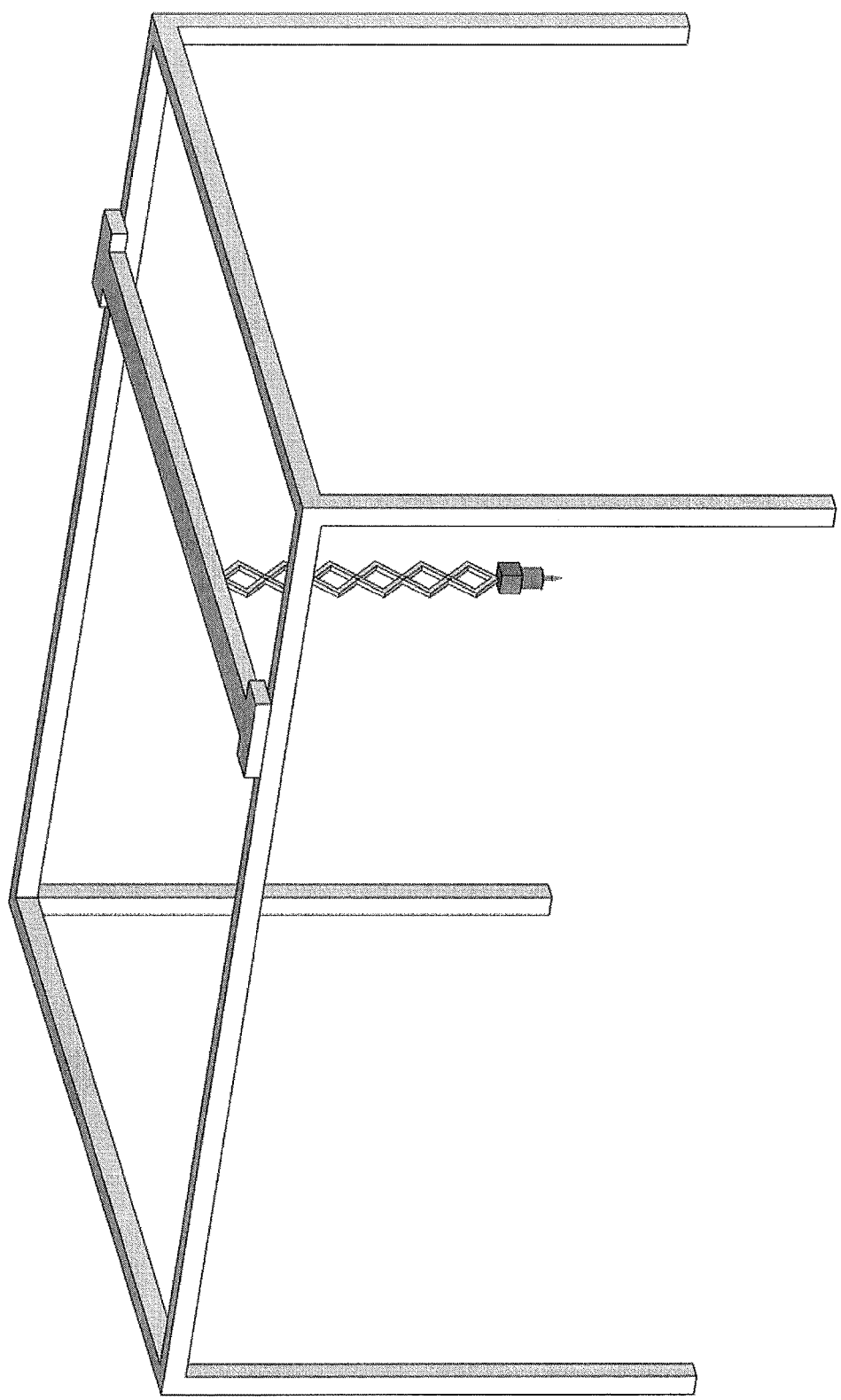
Figure 6C:
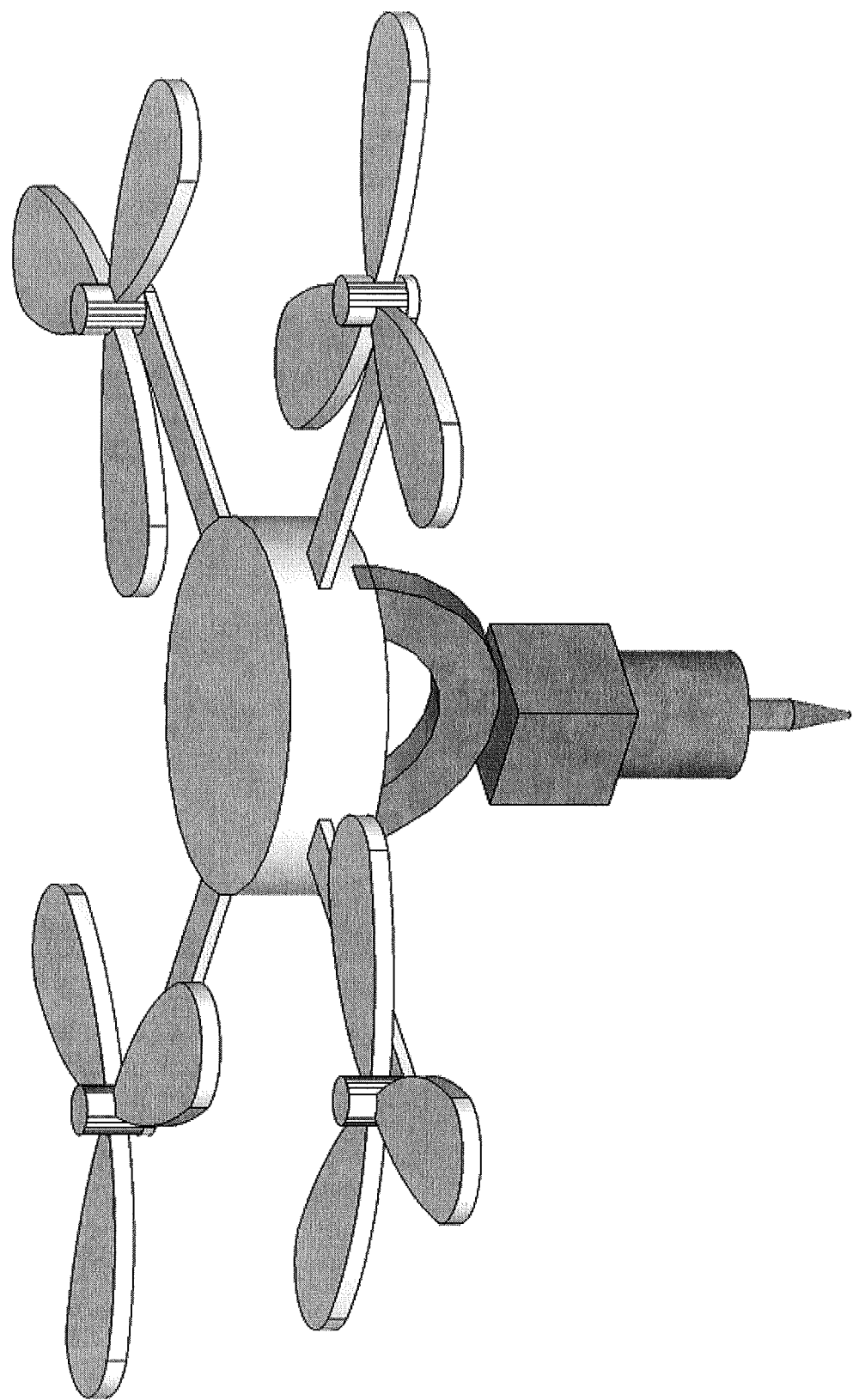

The robot 16 can have an additional angle control 38 that allows the robot 16 to have three full dimensions of translation of the print head 20. The robot 16 can be any motion control device or devices achieving movement of the print head 20 or the printed object 22 in relative three dimension. In this example a parallel robot is used for illustration. Other styles of robots such as a delta configuration (FIG. 6a) or a serial artesian robot (FIG. 6b) can be used. FIG. 6c is an illustration of an autonomous quad rotor flying device which may also be used where the print head 20 is moved under its own power as in some embodiments, the robot 16 may be adapted to move under its own power to a new print position. Other forms and combinations of moving/flying robots thereof can be used and remains within the scope of the disclosure.

In the embodiment shown in FIG. 1, the printed object 22 is on a rotating print platform 18 including a rotation stage controlled by rotation angle 44 and a print platform local coordinate system, or pose, established by print platform tracker 30b. As discussed above, the coordinate system of the object being printed (or global coordinate system) is determined by tracker 30h. As the pose of the object being printed can be transformed into the coordinate space of the printing platform 18, it is possible to determine the rotation angle 44, since the rotation axis is known a priori in the local coordinate space of the print platform 18. Therefore, it is possible to use a lighter weight, less expensive, less accurate rotation control for platform 18. The accuracy is improved by closing the position control loop. The actual rotation angle 44 that has been determined above can be compared to the desired angle produced by the CPU. Any difference can be removed by slightly adjusting the rotation of the print platform 18. This can be repeated until measured angle 44 is achieved within specified tolerances (preferably calculated in arc-seconds). If angle 44 is controlled with sufficient open loop accuracy and the rotation axis is known a priori, then the local coordinate system for the object being printed 22 can be determined from the printing platform coordinate system (derived by tracker 30b) rather than via tracker 30h.

A procedure is now described that allows the system 10 to print an object larger than the print volume of the robot 16. The components of system 10 are placed as needed to allow sufficient space for the robot 16 to move about a spatial envelope of the object being printed 22. The spatial envelope of the robot 16 may be seen as the volume of space that the print head 20 can be moved with all combinations of angles 36a, 36b and 36c within their physical limits. The vision system 32 is placed such that it has convenient line of sight of all components (i.e. all trackers 30). The robot 16 is preferably positioned to be able to reach a first portion of the spatial envelope of the object being printed 22.

In one embodiment, the print platform 18 has a printing plane, in this example a planar circle in 3D space. The printing plane location is known in the coordinate system of the print platform 18 a priori. As the characteristics of the printed plane are now known, no leveling is required and the motion of the print head 20 is aligned to the printing plane of the platform 18. The pose of the robot 16 and the print head 20 is transformed into the global coordinate system, that being the coordinate system of the printed object 22. The computer 12 may then determine what portion of the printed object 22 can be completed with the current position of the robot 16 and platform 18. This portion could be the entire object 22 but it can also be a very small subset of the object thus allowing the printing of object much larger than the reach of the robot 16. The computer 12 may then sequentially activate the platform rotation angle 44; robot angles 36*a*, 36*b* and 36*c*, and print head 20 to move the print head 20, and extrude PLA material onto the plane of the print platform 18. This will proceed until a predetermined portion of the object being printed 22 is completed. The print operation will then pause and the computer 12 can assist the user in guiding the placement of the robot 16 into the optimal location to print the next portion of object 22 or movement instruction may be transmitted to the robot to do its own moving. Printing can now continue, adding PLA material onto the existing portion of object being printed 22. This procedure can be repeated as needed until the entire object 22 is completed or printed.

It should be noted that if the robot 16 is of sufficient accuracy, i.e. angles 36*a*, 36*b*, 36*c* and 38 are accurately known, then the print head tracker 30*g* for the print head 20 is not needed and the pose of the print head 20 can be determined in the local coordinate space (defined by tracker 30*a*) of robot 16 using a mathematical model of the robot 16 with the angles as input and the pose defined by tracker 30*g* as output.

Figure 8:
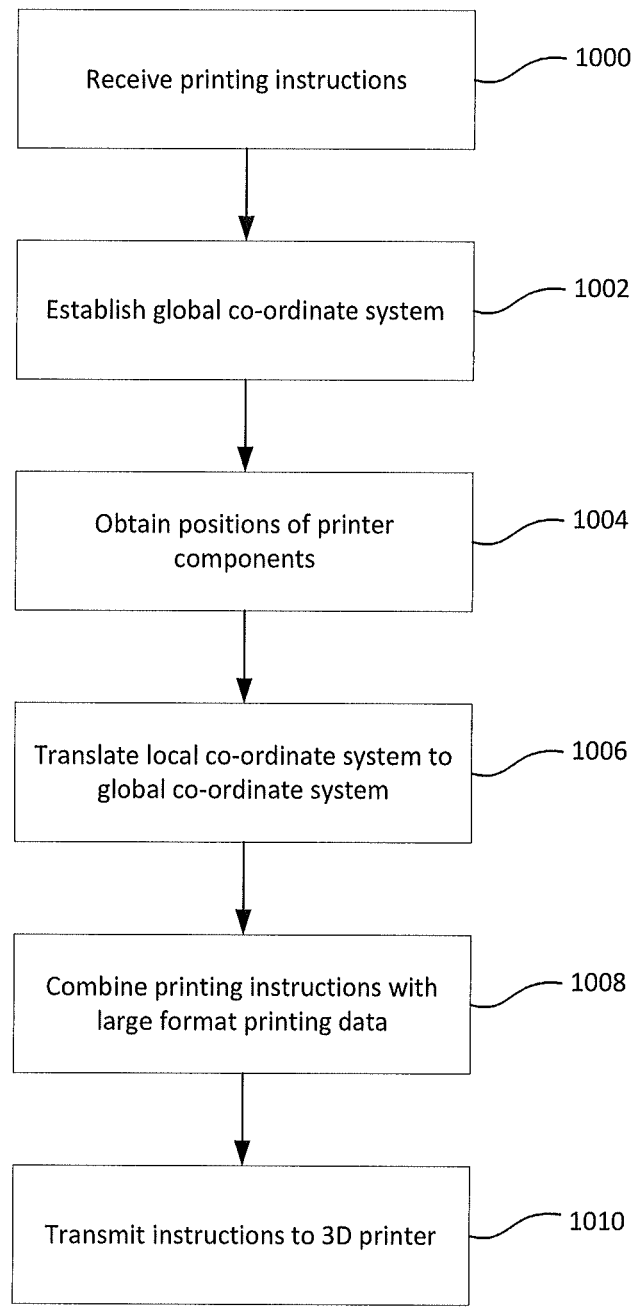
FIG. 8 is a flowchart outlining a first method of large format 3D printing.

Turning to FIG. 8, a flowchart outlining a method of increasing a printing volume of a 3D printer is shown. Initially, printing instructions or information are received from an external transmitter, or processor, 1000. The instructions, or information, may include information for the 3D printer with respect to the object to be printed. The printing instructions may be based on measurements obtained from the scanning of a specimen or may be measurements relating to the object to be printed.

Either before or after receiving the printing instructions, a global coordinate system is established 1002. In one embodiment, the global coordinate system relates to the local coordinate system of the object being printed 22. The global coordinate system may be directly obtained by the 6D tracking machine vision system 32 or may be calculated based on poses obtained by the vision system 32. In this manner, the system has an understanding of the orientation of the object being printed in order to be able to increase the size of the final printed object compared to the original model, or specimen.

After receiving the printing instructions, positioning information of printer components is obtained 1004. This may be achieved by the vision system 32 obtaining pose information from the set of trackers 30. Each of the set of trackers is typically associated with one of the components within the system, or other items, and provide data relating to a local coordinate system for the component or items. In a preferred embodiment, the positioning information relates to the local coordinate system (or pose) of each component that the tracker is associated with. After obtaining the positioning information, the positioning information is then transformed from the local coordinate system to its equivalent within the global coordinate system 1006 to produce large format printing data. The printing information received from the external transmitter is then combined with the large format printing data to produce 3D printing signals 1008. The 3D printing signals are then transmitted to the 3D printer 1010 for the printing of the object.

Figure 9:
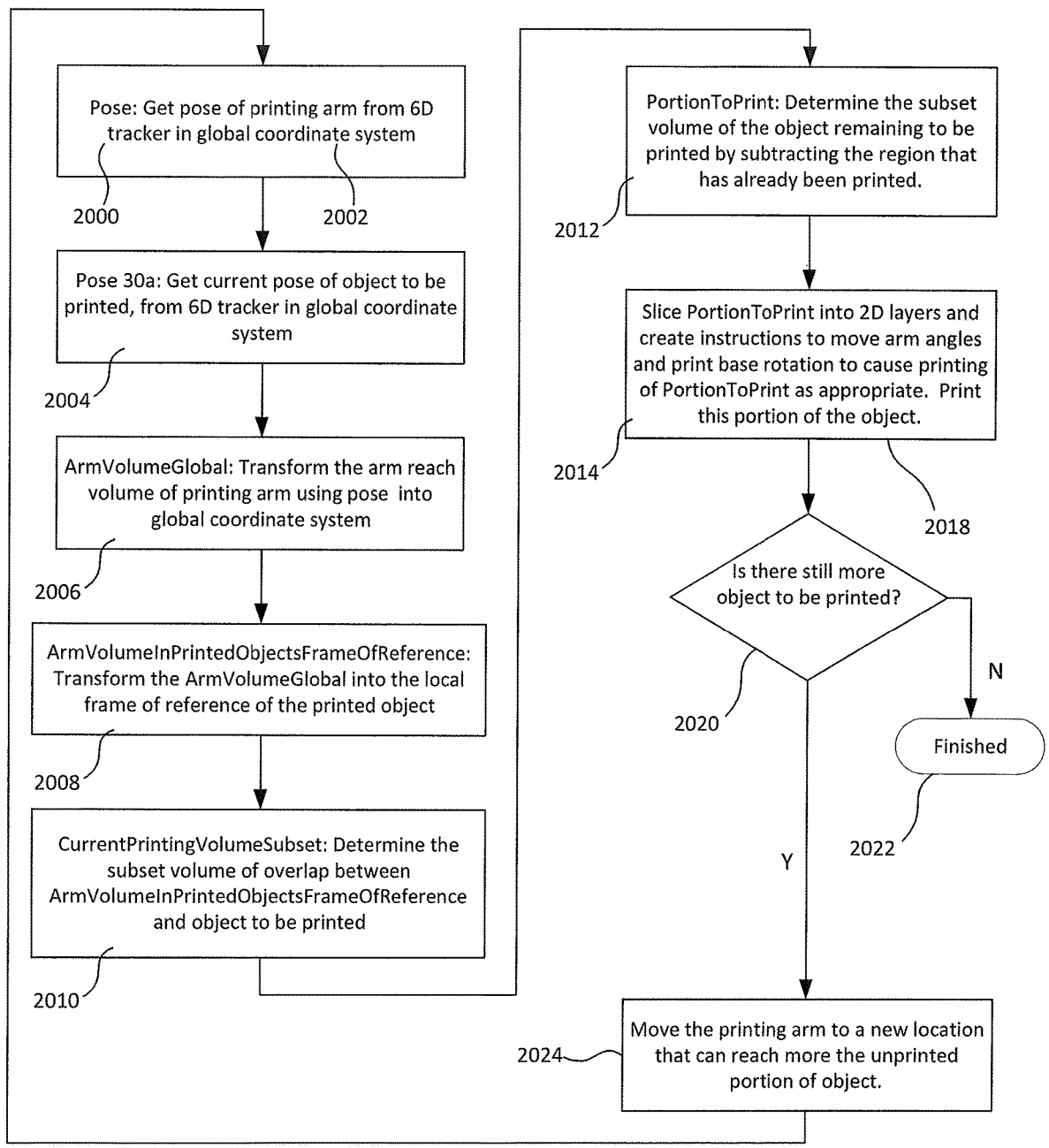
FIG. 9 is a flowchart outlining a second method of large format 3D printing.

Turning to FIG. 9, a flowchart outlining another embodiment of a method of increasing a printing volume of a 3D printer is shown. It is assumed that a global coordinate system has already been established such as by obtaining this information from a tracker associated with the object 22 being printed or a specimen 42 being scanned.

Initially, an industrial robot pose of the industrial robot 16 is obtained 2000. In one embodiment, the industrial robot pose may be obtained by the tracking system 32 via the tracker 30*a*. The industrial robot pose 16 is then transformed from its local coordinate system to a global coordinate system 2002. The pose of the object being printed 22 is then obtained 2004. In some embodiments, this may be the same as the global coordinate system, however, in some embodiments, the established global coordinate system may be different from the pose of the object being printed.

An industrial robot reach volume 40 (shown in FIG. 1) is then transformed into the global coordinate system 2006. In one embodiment, this is performed using the industrial robot pose as obtained in 2000. The industrial reach volume 40 represents the distance that the print head can be moved by the robot 16 with respect to the print platform 18. The industrial robot reach volume 40 is then transformed into a local frame of reference of the printed object 22 2008 to obtain a local reach volume. This may be achieved by transforming the pose of the industrial robot 16 with respect to the pose of the object being printed 22. A subset printing volume of overlap between the reach volume and the volume of the object being printed 22 is then determined 2010.

A further subset volume of the object to be printed 22 remaining to be printed is determined 2012 by subtracting the region that has already been printed from the subset printing volume that is reachable by the current pose of the robot 16. This further subset volume is then sliced 2014 into 2D layers to create instructions 2016 for movement of the industrial robot 16 and the print platform 18 so that the further subset volume is appropriate. These portions are then printed 2018.

A check is then performed to see if there is more of the object 22 to be printed to be printed 2020. If no, the printing process is deemed complete 2022. If yes, the industrial robot 16 is moved to a next printing location 2024 and the method restarted 2000 for the next print head position.

Figure 3:
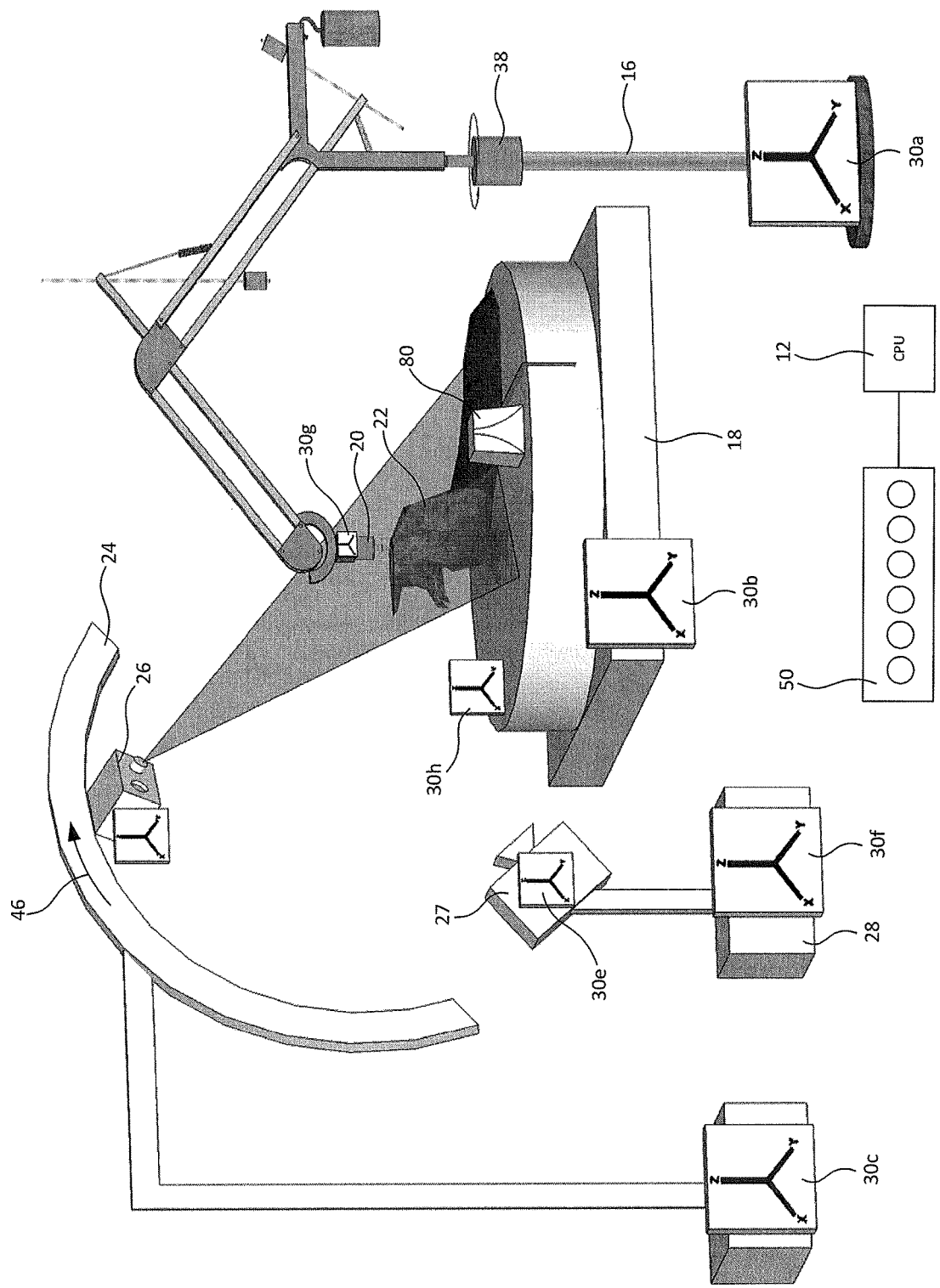
FIG. 3 is another embodiment of a 3D printer system for large format printing.

Turning to FIG. 3, a second embodiment of a 3D printing system is shown. In this embodiment, the 6D tracking system 50 is a magnetic system which does not have line of sight requirements to determine the coordinate systems of the components. The magnetic tracking system 50, of which there are several known in the art, is adapted to return the pose of each component within the global coordinate system as defined by tracker 30*h*. The 6D magnetic tracking system 50 is preferably selected such that it has greater accuracy than the industrial robot 16 and platform 18. In the current embodiment, the trackers 30 may be three orthogonally wound coils. A frame of reference magnetic transmitter 80 produces a magnetic field and induces current in the three coils of the orthogonal windings of each of the trackers 30 to assist the magnetic tracking system 50 to determine the pose of each of the components. As will be understood, the tracking system 50 can determine the pose of the trackers 30 from these induced currents using known methods. All other operations described previously are applicable to the current embodiment with the difference being the tracking systems and the method of tracking the pose of each component. The current embodiment benefits from not needing a line of sight of each tracker to determine a component's pose.

Figure 5:
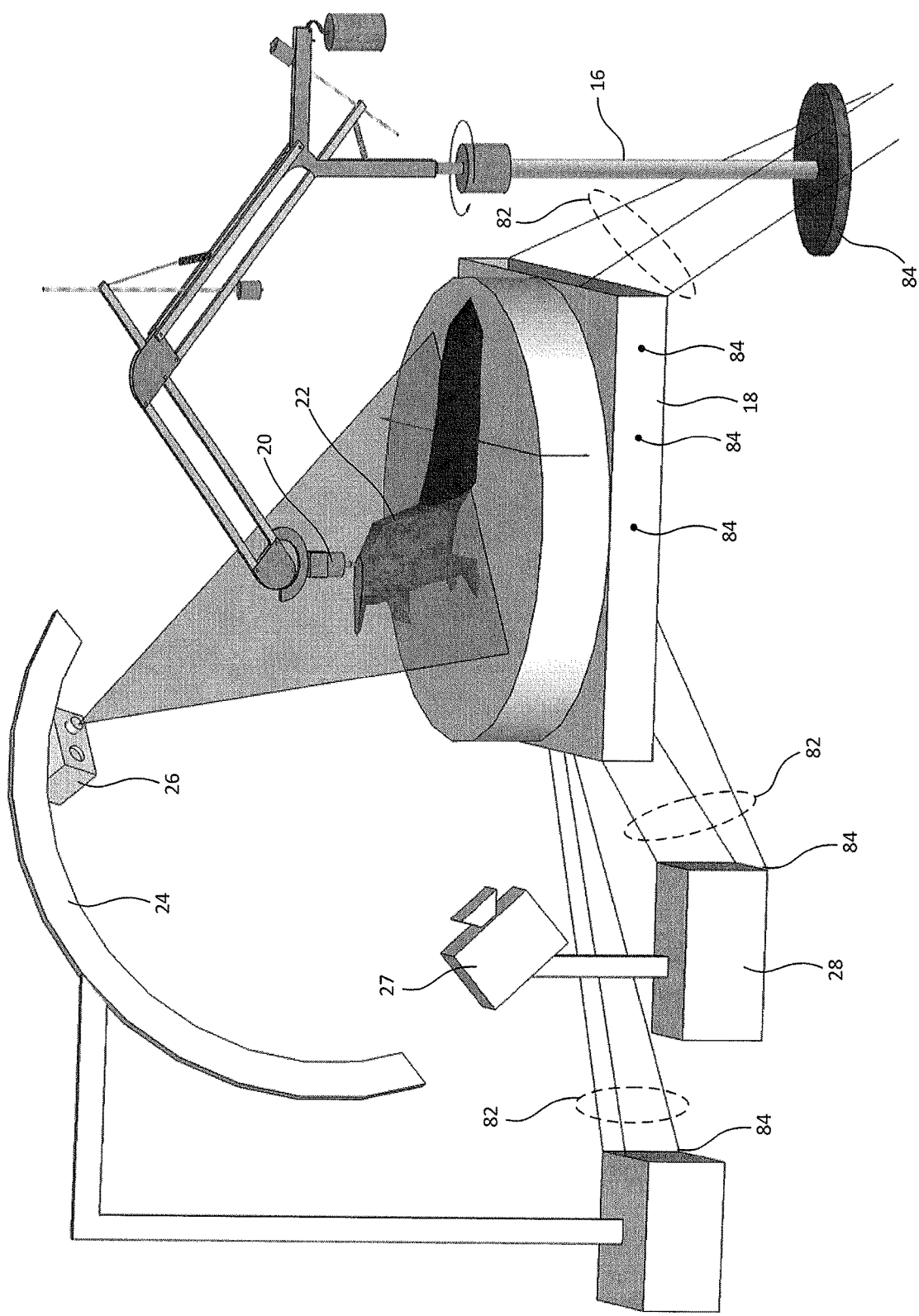
FIG. 5 is a schematic diagram of another embodiment of a 3D printer system.

Turning now to FIG. 5, a third embodiment of a printing system is shown. In this embodiment, there is no external 6D tracking system whereby the components of the 3D printer are physically aligned to each other by connecting members 82 to a plurality of mating sockets 84 in each of the components. The various sockets 84 are distributed about each of the components. The connecting members 82 can be made of a fixed length or can be adapted to be adjustable. If adjustable, the length can have discrete increments or infinite settings. The length can be mechanically indicated from a Vernier scale or like; or automatically read by the control computer 12 if adapted with length detection circuitry, as is known in the art. In one embodiment, the connecting members 82 have different lengths and a plurality of sockets 84 such that the components of the system are able to be flexibly relocated as needed. As will be understood, there are only finite combinations of configurations available. Although this is a restriction compared to using a tracking system, connecting members are less expensive than a tracking system. However, it is not possible to track the moving portions of the system in this manner; printed object 22, scanned specimen 42, print head 20, scanner 26, or anomaly sensor 27, thus the industrial robot 16, the platform 18, the second anomaly tracking robot 28 and the robotic arc 24 beneficially have sufficient open loop accuracy. The connecting members 82, shown in this embodiment in FIG. 5, have three arms between each component by way of illustration. Up to six members may be needed to align components relative to each other while being fully constrained in six degrees of freedom. If other constraints are used in the system, such as all components sitting on a sufficiently precise plane, then only three arms may be needed to constrain the relative position of each component. Each unique connecting member 82 is preferably identified by the computer 12 specifying its length, either automatically using electronic identification, or manually identified and entered by a human operator. In a like manner the identity of each socket 84, used with each member 82, will be either automatically determined using electronic identification, or manually identified and entered by a human operator. The arm length of each connecting member 82 taken with the a priori knowledge of the rigid 3D locations of each socket 84 allows the computer 12 to calculate the pose of each component. The pose of each item is determined relative to the print platform 18 using the known geometry, i.e. the segment lengths of each member 82 and the 3D positions of each socket 84 known in the local coordinate system of each item. This may be mathematically determined using analytical geometry or can be solved using numerical techniques, depending on the complexity, as is known in the art. In this embodiment, the pose of the scanning apparatus 26 is unknown by the control computer 12 if held by hand. However, there are scanning systems that automatically determine the pose of the scanning head relative to the coordinate system of the specimen 42 being scanned. Artificial or naturally occurring fiducial targets on the specimen 42 may be used to establish the specimen's frame of reference or pose.

Figure 7:
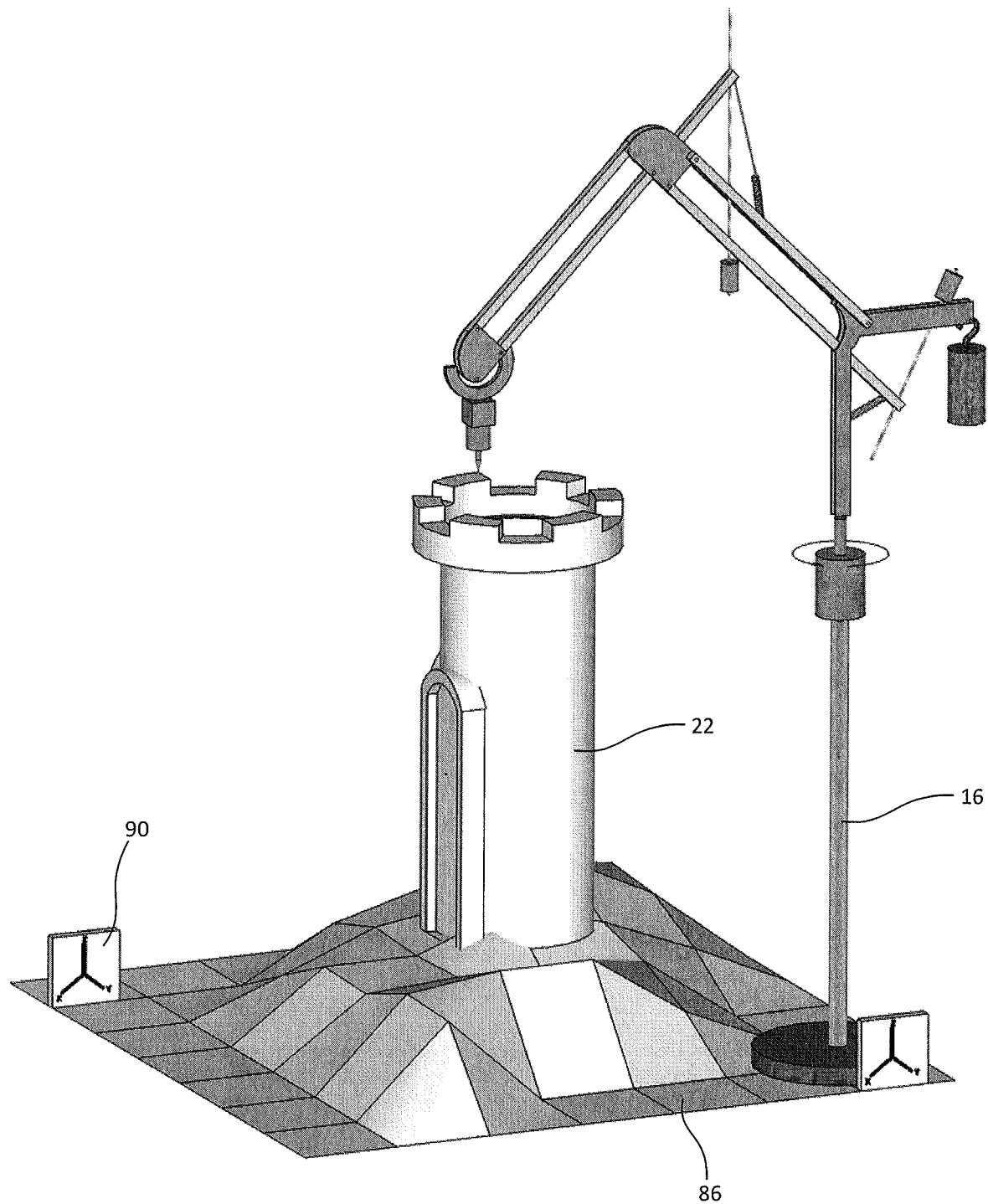
FIG. 7 is a schematic diagram of an object being printed adapted to an irregular print platform or surface.

Another aspect of the disclosure is allowing the scanning of the arbitrary surface on which the object is to be printed. This is schematically illustrated by FIG. 7 in conjunction with FIG. 1. In this embodiment, the object being printed 22 is being printed directly onto an irregular surface 86. For instance, this may occur when the large format printing is a large outdoor sculpture or other structure on an uneven outdoors surface. In this manner, the irregular surface 86 need not be a plane but can be any complex shape. The surface 86 is preferably scanned in a frame of reference 90 of the printed object 22 prior to printing; using the scanning apparatus 26 (not shown) as previously described. The computer 12 can then trim or modify the 3D computer model of the object 22 to fit the surface 86 such that the robot 16 can follow this surface for the first layer of the print. One method is to simply build a foundation upwards from the irregular surface 86 until a complete level plane is available to start the print 32. It is anticipated that more complex methods could be employed such as warping the 3D model to fit the complex surface 86.

Figure 10:
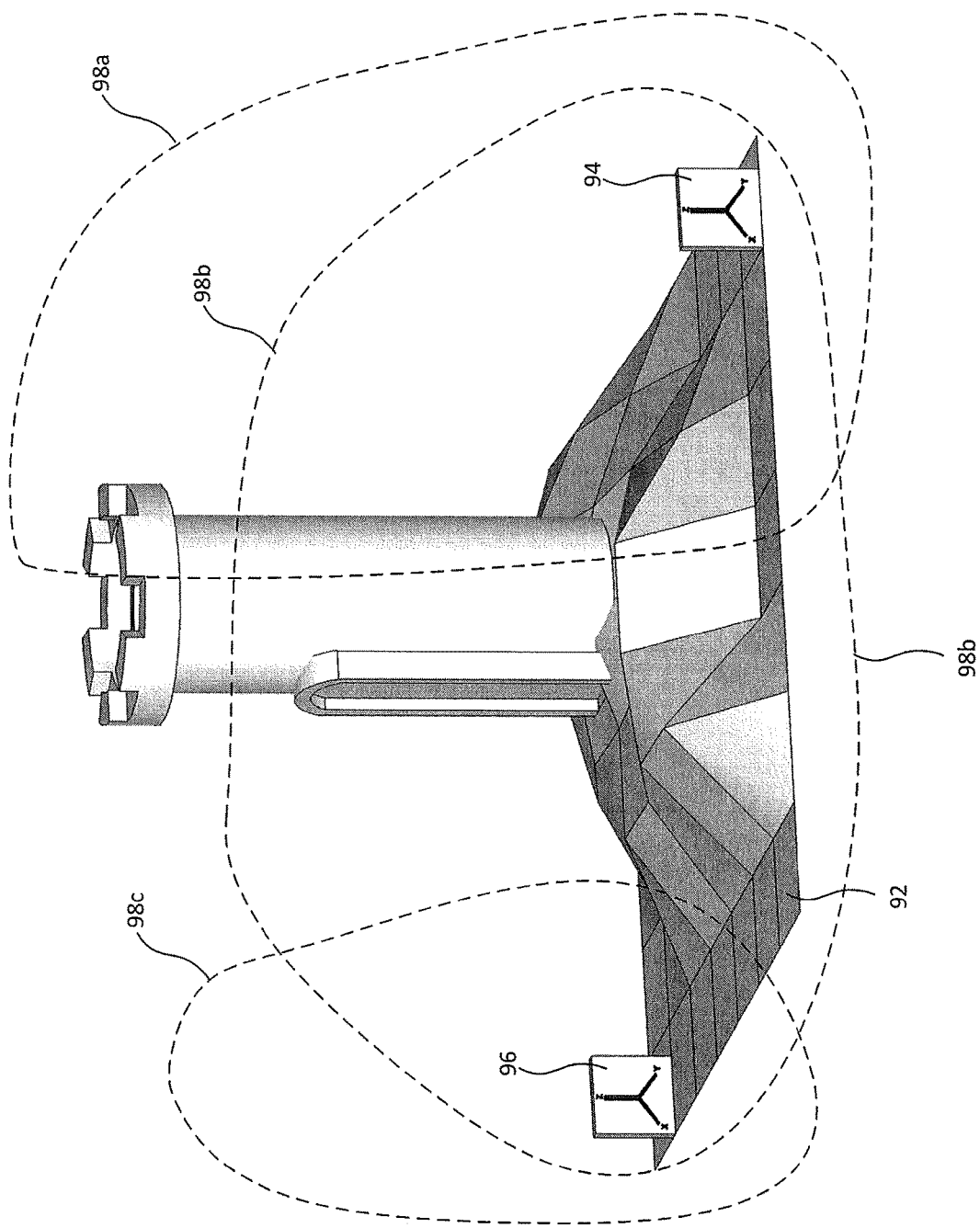
FIG. 10 is a schematic diagram of enlarging 6D tracking measurement volume using leap frog references.

In another embodiment, such as schematically show in FIG. 10, the tracking system measurement volume can be increased as needed by "leap frogging" by use of a reference means. In the methods described previously, it is necessary that the entire printed object 22 fit inside the measurement volume of the 6D tracking system. If printing particularly large objects 22, such as a house, it is difficult, expensive and not necessary to obtain a 6D tracking system with a large enough measurement volume. Therefore, measurement coordinate system tracking can be extended using the method of "leap frogging".

Referring to FIG. 10, the object being printed 22 is shown atop a surface 92. FIG. 10 is related to the embodiment shown in FIG. 7. In this Figure, a pair of trackers 94 and 96 are located diagonally across from each other. The absolute position of these trackers 94 and 96 is not important as long as they can be visible to the 6D tracking system at the same time and do not move relative to the object being printed 22 once that particular tracker 94 or 96 is being used as the reference.

Tracker 94 is used to establish the coordinate system for the object to be printed 22. In operation, the 6D tracking system (not shown) has a measurement volume 98a that encloses tracker 94. The measurement volume is the volume in space that the 6D tracking system 32 can measure. It is assumed that there is a need to move the measurement volume to location 98c. As measurement volume 98a and 98c do not overlap, it is not possible to track the tracker 94 in measurement volume 98c. "Leap Frogging" is done by determining a measurement volume 98b towards 98c such that it intersects both volume 98c and 98a. An additional tracker 96 may be placed in the intersection of volumes 98c and 98b. The pose determined by tracker 96 is then measured relative to the pose of the object being printed (established by tracker 94). The pose of tracker 96 is mathematically transformed to have the coordinate system coincident with tracker 94. It is now possible to move the measurement system to volume 98c and tracking will now be in the coincident coordinate system of the object being printed 22. This procedure can be repeated as needed for larger and larger measurement volumes. For example, at this time tracker 94 can then be physically moved from volume 98a to be within volume 98c. The pose of tracker 94 is then mathematically transformed to have the coordinate system coincident with tracker 96. In this embodiment, the 6D tracking system is moved manually by a human operator in order to continue engaging the trackers 94 and 96. It should be clear that the tracking system can be adapted to move autonomously under its own power.

In the preceding description the preferred embodiments have separate components for 6D tracking vision system, anomaly sensor, and a surface scanner; for the purposes of illustration. It should be clear that any two or all three sensors could be combined into one system adapted to perform each task.

In an embodiment, the tracking system is shown to return the pose of specific trackers. There are systems available that can directly determine the pose of the actual object being printed 22 as it is being printed whereby the pose is determined by the objects image projected onto an image sensor. This image is compared to a computer generated image of the object being printed 22, completed to the same stage, and oriented using a guess for the pose. The guess pose can be adjusted iteratively until the images match within specified tolerance, such as sub-pixel.

In the current embodiment, movement of either the platform or the industrial robot is required in order to allow for the larger format printing. It will be understood that in order to reduce the number of moving parts, only one of the platform or the industrial robot is moved with respect to the other part, however, it may be determined that both may need to be moved in order to allow for the larger format printing.

An advantage of the disclosure is that a print platform that is independent of the print head can be used. Another advantage is that scanning of the arbitrary surface on which the object is to be printed is enabled. This surface need not be a plane but can be any complex shape and it will be scanned in the frame of reference of the object to be printed. Another advantage of the disclosure is that scanning of a specimen that may fall outside of the print volume and may be much larger than the print volume is possible. This can be used to make a 3D copy of the specimen, arbitrarily scale it, make an enclosure, or make a mating piece, etc. As the scanning apparatus is independent of the position of the print head, it may be automatically moved by robot or can even be held by hand. As the surface data obtained from the scanning apparatus is in a known coordinate system relative to the scanner, the coordinate system of the specimen can be tracked simultaneously. It is therefore possible to obtain surface coordinate information, such as a point cloud, in the specimen's frame of reference.

In the preceding description, for purposes of explanation, numerous details are set forth in order to provide a thorough understanding of the embodiments; however the specific details are not necessarily required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

The invention claimed is:

1. A system for large format three-dimensional (3D) printing of an object comprising:
   a processing unit;
   a tracking system;
   a 3D printer including a set of components; and
   a set of trackers in a one-to-one relationship with the set of components, each of the set of trackers defining a local coordinate system for the associated component;
   wherein the tracking system communicates with the set of trackers to obtain information relating to the local coordinate systems; and
   wherein the processing unit calculates positions for the set of components within a global coordinate system based on the local coordinate systems.

2. The system of claim 1 wherein the tracking system is an optical six-dimensional (6D) tracking system.

3. The system of claim 2 wherein the 6D tracking system operates based on mechanical positioning constraints.

4. The system of claim 2 wherein the 6D tracking system is a magnetic system.

5. The system of claim 1 wherein the set of components comprises:
   an industrial robot component;
   a platform component; and
   a print head component mounted to the industrial robot component;
   wherein the industrial robot component controls movement of the print head with respect to the platform component.

6. The system of claim 5 wherein the set of components further comprises:
   a scanning apparatus.

7. The system of claim 6 wherein the set of components further comprises:
   a robotic arm for controlling movement of and supporting the scanning apparatus.

8. The system of claim 5 wherein the set of components further comprises:
   a set of anomaly sensor tracking components.

9. The system of claim 8 wherein the set of anomaly sensor tracking components comprises:
   a camera; and
   a robot to control the camera.

10. The system of claim 1 wherein the processing unit transmits printing instructions to the 3D printer based on the local coordinate systems and measurements of a scanned specimen.

11. A method of large format three-dimensional (3D) printing and scanning comprising:
    determining a global coordinate system;
    receiving local coordinate systems for selected components of a 3D printer;
    transforming each of the local coordinate systems to equivalents within the global coordinate system;
    obtaining measurements of a scanned specimen to be printed;
    combining the measurements and characteristics of the aligned local coordinate systems to generate printing instructions; and
    transmitting printing instructions to the 3D printer.

12. The method of claim 11 wherein determining a global coordinate system comprises:
    retrieving coordinate system information from a tracker associated with an object being printed.

13. The method of claim 11 wherein receiving local coordinate systems comprises:
    retrieving coordinate system information from trackers associated with components of the 3D printer.

14. The method of claim 13 wherein retrieving coordinate system information is performed magnetically.

\* \* \* \* \*